US005530803A

United States Patent [19]
Chang et al.

[11] Patent Number: 5,530,803
[45] Date of Patent: Jun. 25, 1996

[54] METHOD AND APPARATUS FOR PROGRAMMING MEMORY DEVICES

[75] Inventors: George Chang, Cupertino; Pearl Cheng, Los Altos, both of Calif.

[73] Assignee: Advanced Micro Devices, Inc., Sunnyvale, Calif.

[21] Appl. No.: 227,755

[22] Filed: Apr. 14, 1994

[51] Int. Cl.⁶ .................................................. G06F 11/00
[52] U.S. Cl. ........................................................ 395/183.18
[58] Field of Search .......................... 371/21.1; 395/575, 395/500, 700, 183.18; 364/252.3

[56] References Cited

U.S. PATENT DOCUMENTS

| | | | |
|---|---|---|---|
| 4,701,886 | 10/1987 | Sakakibara et al. | 365/189 |
| 4,729,117 | 3/1988 | Osaka | 365/200 |
| 4,841,233 | 6/1989 | Yoshida | 324/73 R |
| 4,862,418 | 8/1989 | Cuppens et al. | 365/201 |
| 4,905,191 | 2/1990 | Arai | 371/21.2 |
| 5,091,910 | 2/1992 | Ochi | 371/40.1 |
| 5,224,103 | 6/1993 | Ligthart et al. | 371/22.4 |
| 5,228,000 | 7/1993 | Yamagata | 365/201 |

OTHER PUBLICATIONS

I. S. Hwang and A. L. Fisher, "Ultrafact Compact 32-bit CMOS in Multiple-Output Domino Logic", IEEE Journal of Solid State Circuits, vol. 24, No. 2, Apr. 1989, pp. 358-369.
John P. Uyemura, "Circuit Design for CMOS VLSI", 1992, pp. 322-328.

*Primary Examiner*—Robert W. Beausoliel, Jr.
*Assistant Examiner*—Stephen C. Elmore
*Attorney, Agent, or Firm*—Raymond Kam-On Kwong

[57] ABSTRACT

A method for programming an integrated memory circuit and an integrated memory circuit structure for storing information are disclosed. The method of programming includes the steps of providing a program mode for programming the memory cells in accordance with total number of memory cells that is required to be programmed; and programming the memory cells in accordance with the program mode. The integrated memory circuit includes a program mode determining circuit, and a programming circuit operatively coupled to the program mode determining circuit for programming each of a plurality of block of memory cells according to its respective program mode. The program mode determining circuit comprises a circuit for determining the total number of memory cells that is required to be programmed in each block and a control circuit operatively coupled to the memory cells determining circuit for providing a first program mode control signal, a plurality of second program mode control signals and a third program mode control signal, if the total number of memory cells that are required to be programmed in a block is greater than zero but is less than or equal to a threshold number N, greater than the threshold number N, and equal to zero, respectively. Through the use of the programming method and the integrated memory circuit design, the requirement of additional number or increased current capacities of drain pumps associated with programming the integrated circuit is eliminated which reduces design complexity and minimizes the size of the integrated circuit.

30 Claims, 5 Drawing Sheets

METHOD AND APPARATUS FOR PROGRAMMING MEMORY DEVICES

FIELD OF THE INVENTION

The present invention is generally related to an electrically programmable memory device and more specifically, to a method and apparatus for programming flash EPROMs.

BACKGROUND OF THE INVENTION

Flash EPROMs (erasable programmable read only memories) are a growing class of non-volatile storage integrated circuits. These flash EPROMs have integrated memory cells which can be electrically erasable, programmable or readable. The entire array can be simultaneously erased electrically. The flash EPROM can also be randomly read or written.

The cells themselves use only a single device per cell and are formed using so-called floating gate transistors in which the data is stored in a cell by charging or discharging the floating gate. The floating gate is a conductive material, typically made of polysilicon, which is insulated from the channel of the transistor by a thin layer of oxide or other insulating material, and insulated from the control gate word line of the transistor by a second layer of insulating material.

The act of charging the floating gate is termed the "program" step for a flash EPROM. This is accomplished through a so-called hot-electron injection by establishing a large positive voltage between the gate and source, as much as 12 volts, and a positive voltage between the drain and source, for instance, 6 volts. A drain pump supplies the current needed to program the memory cells.

The act of discharging the floating gate is called the "erase" function for a flash EPROM. This erasure function is typically carried out by a Fowler-Nordheim tunneling mechanism between the floating gate and the source of the transistor (source erase) or between the floating gate and the substrate (channel erase). For instance, a source erase operation is induced by establishing a large positive voltage from the source to gate, while floating the drain of the respective memory cell. This positive voltage may be as much as 12 volts.

A problem encountered with the conventional way in which flash EPROM cells are programmed is the large amount of current required for programming a high density flash EPROM memory device. A typical flash EPROM memory device has 1 million bits (megabits or Mbit) of memory cells organized as 128 thousand (K) bytes of 8 bits each. Typically, all 8 bits are programmed at the same time. When the voltage supplied to the integrated circuit is at 12 volts, it will be high enough to provide the current needed to program the memory cells. As the personal computer industry is progressing towards size reduction and mobile computing, notebook and subnotebook computer applications become very popular. In these applications, power consumption is a concern since batteries are typically used to supply electrical power to notebook and subnotebook computers. It is known that an integrated circuit which uses a lower supply voltage consumes less power. Therefore, most of the integrated circuits used for these applications are designed to work with a lower supply voltage. Accordingly, there is a growing demand for memory devices that have supply voltage lower than the 12 volts previously used. Nowadays, the supply voltage is being reduced to 5 volts and is expected to be further reduced to 3.3 volts in the near future. When the supply voltage is at 5 volts or below, a drain pump is required to pump up the supply voltage so that there is sufficient current to program up to 8 bits of memory cells simultaneously. Further, as the microprocessor technology advances, higher density flash EPROM memory devices are required. The industry's demand is towards requiring flash EPROMs having storage capacity of 4 Mbit and 16 Mbit, organized as 256K words of 16 bits each and 1 million words of 16 bits each respectively. In these flash EPROMs, 16 bits of memory cells may have to be programmed at one time thus doubling the current requirement as compared to the programming of only 8 bits of memory cells simultaneously in previous devices. There has been an attempt to solve the problem of delivering more current to 4 Mbit or 16 Mbit devices by doubling the number of drain pumps or increasing the size of the existing drain pumps so as to increase their current capacities.

While using more drain pumps or increasing the current capacity of drain pump will be able to supply adequate current to 4 Mbit or 16 Mbit memory devices, it undesirably adds complexity to the design of the integrated circuits. Besides, increasing the number of drain pumps or increasing the size of the drain pump increases the overall size of the integrated circuit where the flash EPROM resided. Further, as the demand for higher density flash EPROM memory device grows, there is an expectation that the number of bits to be programmed will continue to increase and a better way of providing the current needed for such high density devices is necessary. Hence, there is a need to have a method and an apparatus for programming high density flash EPROM memory devices with low supply voltage without undesirably increasing the complexity of the design and the size of the integrated circuit. The present invention addresses such a need.

SUMMARY OF THE INVENTION

Accordingly, it is a general aspect of the present invention to provide a method for programming a plurality of memory cells, formed on an integrated circuit, in response to an input data pattern without unnecessarily increasing the size of the integrated circuit when the number of memory cells that is required to be programmed increases. It is another aspect of the present invention to provide a method of programming of plurality of memory cells formed on an integrated circuit without unnecessarily increasing the number or the size of the drain pump used for providing current during programming when the number of memory cells that is required to be programmed increases.

It is yet another aspect of the present invention to provide an integrated memory circuit, responsive to an input data pattern, which allows the programming of a plurality of memory cells formed on the integrated circuit without unnecessarily increasing the size of the integrated circuit when the number of memory cells that is required to be programmed increases. It is another aspect of the present invention to provide an integrated memory circuit, responsive to an input data pattern, which allows the programming of a plurality of memory cells formed on the integrated circuit without unnecessarily increasing the number or the size of the drain pump used for providing current during programming when the number of memory cells that is required to be programmed increases.

In accordance with these aims and aspects, the present invention is concerned with the provision of a method for programming a plurality of memory cells in response to an input data pattern having a plurality of bits of information. Each bit is either at a first logic level or a second logic level, and each of the memory cells is used for storing a bit of information. The method comprises the steps of providing a program mode for programming the memory cells in accordance with total number of memory cells that is required to be programmed and then programming the memory cells in accordance with the program mode.

The step of providing the program mode includes the steps of determining the total number of memory cells that is required to be programmed; and providing a first program mode control signal if the total number of memory cells that is required to be programmed is greater than zero but is less than or equal to a threshold number N, providing a second program mode control signal if the total number of memory cells that is required to be programmed is more than the threshold number N, and providing a third program mode control signal if the total number of memory cells that is required to be programmed is equal to zero.

The step of determining the total number of memory cells that is required to be programmed comprises the steps of comparing the logic level of each bit of the input data pattern with the logic level of each corresponding bit stored in the memory cells; and computing the total number of memory cells that is required to be programmed by summing the total number of bits of the input data patterns that are at the first logic level.

The present invention is also concerned with the provision of an integrated memory circuit responsive to an input data pattern having a plurality of bits of information. Each bit is either at a first logic level or a second logic level. The integrated memory circuit has a plurality of memory cells and each of the memory cells is used for storing one bit of information. The integrated memory circuit comprises a program mode determining circuit for determining a program mode for programming the memory cells in accordance with total number of memory cells that is required to be programmed; and a programming circuit operatively coupled to the program mode determining circuit for programming the memory cells in accordance with the program mode.

The program mode determining circuit comprises a memory cell determining circuit for determining the total number of memory cells that is required to be programmed; and a control circuit for providing a first program mode control signal if the total number of memory cells that is required to be programmed is greater than zero but is less than or equal to a threshold number N, providing a second program mode control signal if the total number of memory cells that is required to be programmed is more than the threshold number N, and providing a third program mode control signal if the total number of memory cells that is required to be programmed is equal to zero.

Through this programming method or circuit design, a high density integrated memory circuit can be efficiently programmed without having to increase the number and/or the size of the drain pumps formed on the integrated circuit, thus maintaining the size of the integrated circuit to a minimum. This method or system adds minimal additional hardware and does not appreciably affect the programming time of the memory circuit.

DETAILED DESCRIPTION

The present invention relates to a method and an integrated memory circuit for programming high density memory cells without undesirably increasing the number or the size of drain pumps formed on the integrated circuit. The following description is presented to enable one of ordinary skill in the art to make and use the invention as provided in the context of a particular application and its requirements. Various modifications to the preferred embodiment will be readily apparent to those skilled in the art, and the generic principles which are accompanied in this embodiment may be applied to other embodiments. Thus, the present invention is not intended to be limited to the embodiments shown, but is to be accorded the scope consistent with the principles and novel features disclosed herein.

Figure 1:
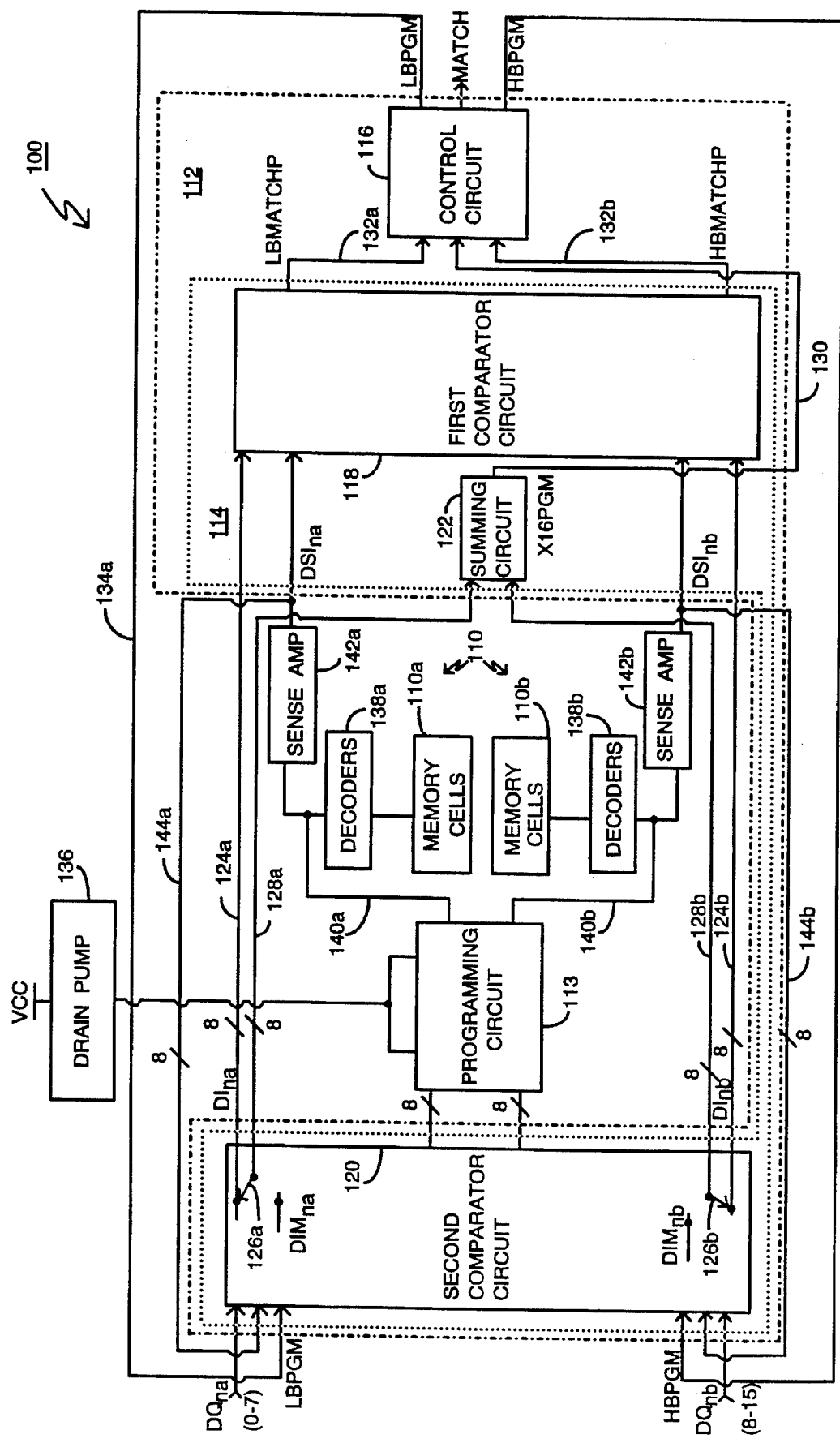
FIG. 1 is a simplified block diagram of an integrated memory circuit constructed in accordance with the present invention.

FIG. 1 illustrates an integrated memory circuit 100 constructed in accordance with the present invention.

The integrated memory circuit 100 is responsive to an input data pattern $DQ_n$ ($DQ_0$ to $DQ_{15}$) which has 16 bits of information. Each bit is either at a first logic level or a second logic level. For the purpose of illustration, the first logic level is assumed to be a logic 0, while the second logic level is assumed to be a logic 1. The input data pattern $DQ_n$ is separated into two bytes, a low byte $DQ_{na}$ ($DQ_{0b}$ to $DQ_{7a}$) which represents the 0th to 7th bits and a high byte $DQ_{nb}$ ($DQ_{8b}$ to $DQ_{15b}$), which represents the 8th to 15th bits. The integrated memory circuit 100 includes a matrix of programmable memory cells. Each memory cell is used for storing 1 bit of information. The matrix of memory cells are organized into a plurality of blocks, and each block includes 2 groups of memory cells and each group includes 8 memory cells. In the case of a 4 Mbit flash EPROMS organized as 256K words of 16 bits each, each word is equivalent to one block; i.e., there are 256K blocks. Each block is further divided into 2 groups of 8 bits each. Each bit is represented by 1 memory cell. For the purpose of illustration, FIG. 1 only shows 1 block of memory cells 110. Memory cells block 110 includes 2 groups of memory cells 110a and 110b. Memory cells 110a and 110b each includes 8 memory cells.

For the purpose of this embodiment, when a memory cell is erased, it will be at logic 1. When a memory cell is programmed, it will be at logic 0.

The integrated memory circuit 100 further includes a program mode determining circuit 112 for determining a program mode for programming block 110 in accordance with a number of the bits of the input data pattern $DQ_n$ and a programming circuit 113 operatively coupled to the program mode determining circuit 112 for programming block 110 according to its respective program mode. In this embodiment, the number of the bits of the input data pattern $DQ_n$ chosen for the purpose of program mode determination is 8, which is the number of memory cells a typical drain pump residing on the integrated memory circuit is able to supply simultaneously during programming.

The program mode determining circuit 112 includes a memory cell determining circuit 114 for determining the total number of memory cells that is required to be programmed in block 110 and a control circuit 116 operatively coupled to the memory cell determining circuit 114 for providing a first program mode control signal if the total number of memory cells that is to be programmed in block 110 is greater than zero but is less than or equal to 8, a second program mode if the total number of memory cells that is required to be programmed in block 110 is more than 8, and a third program mode control signal if the total number of memory cells that is required to be programmed in block 110 is equal to zero.

The memory cell determining circuit 114 includes a first comparator circuit 118, a second comparator circuit 120 and a summing circuit 122.

The first comparator circuit 118 is used for comparing the logic level of each bit of the input data pattern $DQ_n$ addressed to block 110 with the logic level of each of the memory cell in block 110.

The second comparator circuit 120 is used for comparing the logic level of each bit of the input data pattern $DQ_n$ with the logic level of each corresponding bit stored in the memory cells, 110a and 110b, and providing a modified input data pattern $DIM_{na}$ ($DIM_{0a}$ to $DIM_{7a}$) and $DIM_{nb}$ ($DIM_{8b}$ to $DIM_{15b}$).

When a bit of the memory cells 110a (or 110b) and the corresponding bit of the input data pattern $DQ_{na}$ (or $DQ_{nb}$) are both at logic 1, the corresponding bit of the modified input data pattern $DIM_{na}$ (or $DIM_{nb}$) will be at logic 1. This indicates no programming is required for that bit.

When a bit of the memory cells 110a (or 110b) and the corresponding bit of the input data pattern $DQ_{na}$ (or $DQ_{nb}$) are both at logic 0, the corresponding bit of the modified input data pattern $DIM_{na}$ (or $DIM_{nb}$) will be at logic 1. Again, this indicates no programming is required for that bit.

When a bit of the memory cells 110a (or 110b) is at logic 1 and the corresponding bit of the input data pattern $DQ_{na}$ (or $DQ_{nb}$) is at logic 0, the corresponding bit of the modified input data pattern $DIM_{na}$ (or $DIM_{nb}$) will be at logic 0. This indicates that programming is required for that bit.

Input data patterns $DQ_{na}$ and $DQ_{nb}$ are being applied to the second comparator 120. The second comparator 120 then generates data patterns $DI_{na}$ and $DIM_{na}$. $DI_{na}$ is identical to $DQ_{na}$ and will be indicated as input data pattern in this embodiment. $DIM_{na}$ is a modified input data pattern as explained above. The second comparator 120 also provides data patterns $DI_{nb}$ and $DIM_{nb}$. Similarly, $DI_{nb}$ is identical to $DQ_{nb}$ and will be indicated as input data pattern in this embodiment. $DIM_{nb}$ is a modified input data pattern as explained above. $DI_{na}$ is coupled to the first comparator circuit 118 through line 124a. $DI_{na}$ or $DIM_{na}$ is selectively coupled to the summing circuit 122 through a selective switch 126a in the second comparator 120 across line 128a. Similarly, $DI_{nb}$ is coupled to the first comparator circuit 118 through line 124b and $DI_{nb}$ or $DIM_{nb}$ is selectively coupled by switch 126b on line 128b to the summing circuit 122.

Summing circuit 122 can be implemented by a digital adding circuit or an analog adding circuit. A typical digital adding circuit comprises a plurality of half and full digital adders to provide logical addition by summing the bits of the input data patterns $DI_{na}$ and $DI_{nb}$ or the modified input data patterns $DIM_{na}$ and $DIM_{nb}$ that are at logic 0. In this embodiment, 7 half digital adders and 19 full digital adders are used to accomplish the logic addition. A discussion on the implementation of digital adding circuit may be found in a book entitled "Circuit Design for CMOS VLSI," 1992, Pages 322–328, by John Uyemura.

In contrast, a typical analog adding circuit sums the current through a plurality of transistors.

In this embodiment, analog adding circuits are preferred because it is found that implementation of analog adding circuits here takes up less area on the integrated memory circuit than digital adding circuits.

The summing circuit 122 computes the total number of bits of memory cells 110a and 110b that is required to be programmed by selectively summing the total number of bits of the input data patterns $DQ_{na}$ and $DQ_{nb}$ or the corresponding modified input data patterns $DIM_{na}$ and $DIM_{na}$ addressed to block 110 that are at logic 0 and then produces output signal X16PGM. The output signal X16PGM output signal will be at logic 1 when the number of memory cells that is required to be programmed is greater than zero but is less or equal to 8 and logic 0 when the total number of memory cells that is required to be programmed is greater than 8. Output signal X16PGM couples to control circuit 116 on line 130.

The first comparator circuit 118 outputs signals LBMATCHP and HBMATCHP to control circuit 116 across lines 132a and 132b respectively. Control circuit 116 provides signal LBPGM and signal HBPGM to the second comparator circuit 120 across lines 134a and 134b respectively. Control circuit 116 provides a MATCH signal when the content of the memory cells 110a and 110b matches the contents of the input data pattern $DQ_n$.

The programming circuit 113 couples to drain pump 136. Drain pump 136 is coupled to a power supply VCC, typically at 5 volts. Memory cells 110a and 110b couple to a plurality of decoders 138a and 138b respectively. Decoders 138a and 138b couple to the programming circuit 113 via lines 140a and 140b respectively. Decoders 138a couple memory cells 110a through a first plurality of sense amplifiers 142a to the first comparator circuit 118. Similarly, decoders 138b couple memory cells 110b through a second plurality of sense amplifiers 142 b to the first comparator circuit 118. Sense amplifiers 142a and 142b provide data pattern $DSI_{na}$ and $DSI_{nb}$ respectively. Data pattern $DSI_{na}$ and $DSI_{nb}$ represent the contents of memory cells 110a and 110b respectively. Data pattern $DSI_{na}$ and $DSI_{nb}$ are being coupled to the second comparator circuit 120 on lines 144a and 144b respectively.

The programming of integrated memory circuit 100 comprises three operations, namely a preprogram verification operation, a programming operation, and postprogramming verification operation. Immediately prior to the preprogram verification operation, memory cells 100a and 110b are assumed to have been fully erased, that is, they are all at logic 1.

Figure 2:
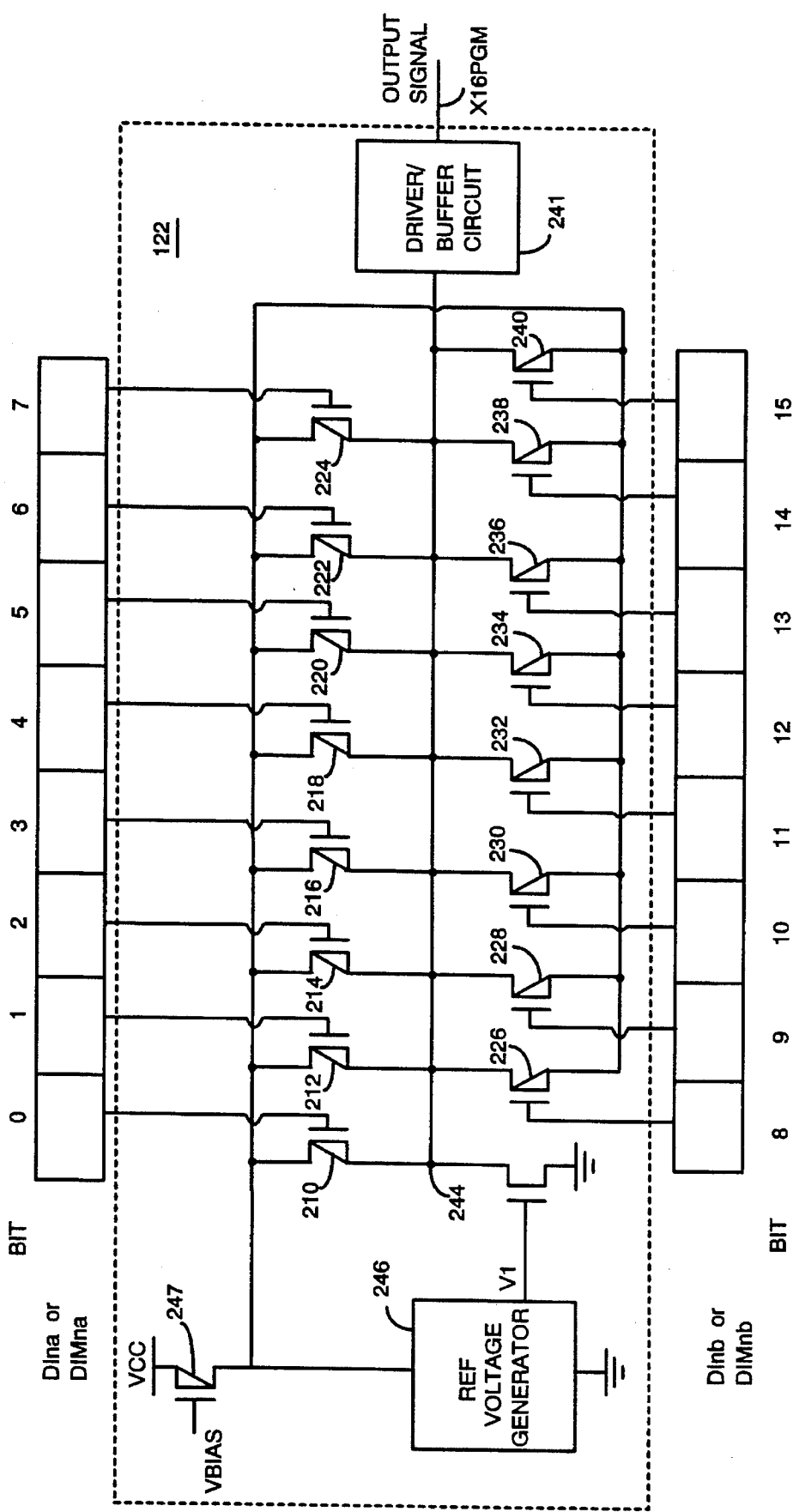
FIG. 2 is a schematic circuit diagram of an analog adding circuit used to implement the summing circuit of FIG. 1.

Referring to FIG. 2, which is a detailed circuit diagram of an analog adding circuit used to implement summing circuit 122. Summing circuit 122 uses the principle of a differential comparator circuits to provide for current summation. Summing circuit 122 comprises a plurality of transistors 210, 212, 214, 216, 218, 220, 222, 224, 226, 228, 230, 232, 234, 236, 238 and 240 coupled in parallel. The drain terminal of the plurality of transistors 210, 212, 214, 216, 218, 220, 222, 224, 226, 228, 230, 232, 234, 236, 238 and 240 is coupled to a node 244 and a driver/buffer circuit 241. The gate terminal of each of the plurality of transistors 210, 212, 214, 216, 218, 220, 222 and 224 is repsectively coupled to bit 0, 1, 2, 3, 4, 5, 6 and 7 of the input data patterns $DI_{na}$ or the modified input data pattern $DIM_{na}$. Similarly, the gate terminal of each of the plurality of transistors 226, 228, 230, 232, 234, 236, 238 and 240 is respectively coupled to bit 8, 9, 10, 11, 12, 13, 14 and 15 of the input data pattern $DI_{nb}$ or the modified input data patterns $DIM_{nb}$. The source terminal of each of the plurality of transistors 210, 212, 214, 216, 218, 220, 222, 224, 226, 228, 230, 232, 234, 236, 238 and 240 is coupled to the drain terminal of a current source transistor 247. Current source transistor 247 has its gate terminal coupled to a voltage VBIAS and its source terminal coupled to power supply voltage VCC. Current source transistor 247 acts as a constant current source for the summing circuit 122.

Each one of the plurality of transistors is turned on to allow current through the transistor when the corresponding bit coupled to the gate of that transistor is at logic 0. The total current through the plurality of transistors, which is dependent on the total number of transistors being turned on, is then summed at point 244. Next, the corresponding total voltage drop due to the total current is compared with a reference voltage V1 generated by a reference voltage generator 246 and an output signal X16PGM is provided via node 244 and driver/buffer circuit 241. In this embodiment, the reference voltage V1 is selected such that the output signal X16PGM will be at logic 0 and logic 1 when the total number of logic 0 bits of the input data patterns $DI_{na}$ and $DI_{nb}$ (or the modified input data patterns $DIM_{na}$ and $DIM_{nb}$) is greater than 8 and less than or equal to 8 respectively.

Figure 3:
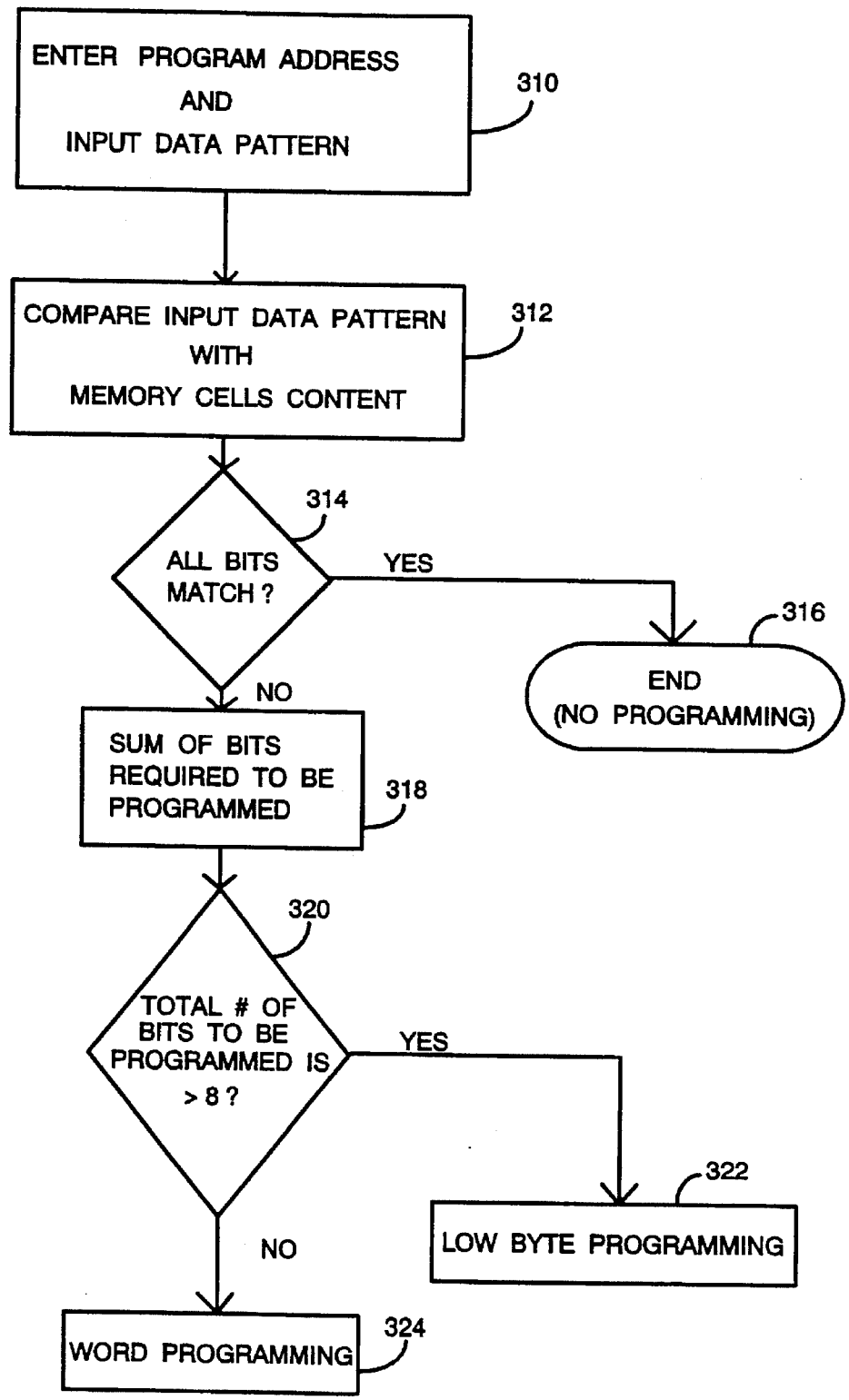
FIG. 3 is a flow chart showing a preprogram verification operation in accordance with the present invention.

Referring now to FIG. 3, what is depicted is the preprogram verification operation of the integrated memory circuit 100 as illustrated in FIG. 1. Initially, a program address and input data patterns $DQ_{na}$ and $DQ_{nb}$ are provided to the second comparator 120 via step 310. $DQ_{na}$ and $DQ_{nb}$ are being latched by second comparator circuit 120 to provide signals $DI_{na}$ and $DI_{nb}$ respectively. The first comparator circuit 118 compares the input data patterns $DI_{na}$ and $DI_{nb}$ with the contents of the memory cells 110a and 110b respectively, and then output LBMATCHP signal and an HBMATCHP signal respectively via step 312. LBMATCHP will be at logic 0 whenever there is at least one bit in memory cells 110a that does not match with the corresponding bits of the input data pattern $DQ_{na}$; otherwise, LBMATCHP will be at logic 1. Similarly, HBMATCHP will be at logic 0 whenever there is at least one bit in memory cells 110b that does not match with the corresponding bits of the input data pattern $DQ_{nb}$; otherwise, HBMATCHP will be at logic 1.

Next, it must be determined whether the contents of the memory cells 110a and 110b match the corresponding bit of the input data pattern $DQ_{na}$ and $DQ_{nb}$ via step 314. If each of the bits in the memory cells 110a and 110b matches with the corresponding bits of the input data pattern $DQ_{na}$ and $DQ_{nb}$, the signals LBMATCHP and HBMATCHP will both be at logic 1. In response, a MATCH signal which is at logic 1 will be provided by the control circuit 116 indicating that no programming is required via step 316. When the MATCH signal is at logic 1, it is also known as the third program mode control signal. In case the contents of the memory cells 110a or 110b do not match with the input data pattern $DQ_{na}$ or $DQ_{nb}$, the total number of bits that is required to be programmed must be determined via step 318. The summing circuit sums the number of bits of the input data patterns $DQ_{na}$ and $DQ_{nb}$ that are at logic 0 and generates output signal X16PGM. When a bit of the input data pattern $DQ_{na}$ or $DQ_{nb}$ is at logic 0, it indicates that programming of the corresponding bit in memory cells 110a or 110b is required, since all the bits in the memory cells 110a and 110b are presumed to have been erased, that is, they were all at logic 1, immediately prior to the preprogram verification operation.

Next, it must be determined whether the total number of bits required to be programmed is greater than 8 via step 320. If the total number of bits that is required to be programmed is greater than 8, which is indicated by output signal X16PGM being at logic 0, a low byte or two-cycle programming will be performed via step 322. In case the total number of bits that is required to be programmed is greater than zero but is less than or equal to 8, then a word programming must be performed via step 324. In that case, both the high byte and the low byte will be programmed at the same time using one-cycle programming.

Figure 4A:
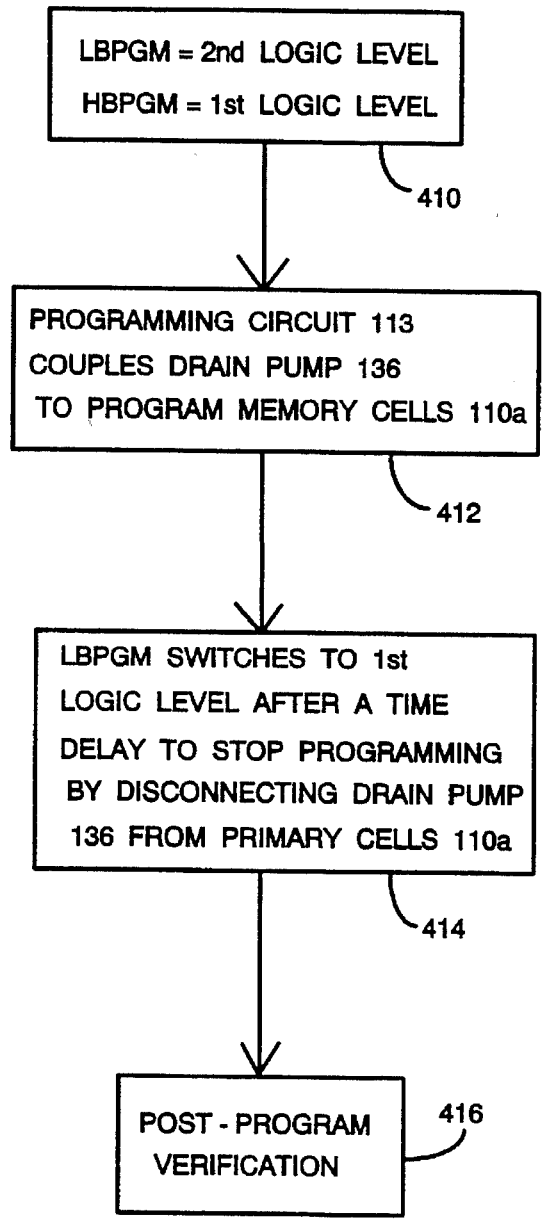
FIG. 4A is a flow chart showing a two-cycle or low byte programming operation in accordance with the present invention as illustrated in FIG. 1 above.

Referring now to FIG. 4A, what is shown is a flow chart showing the operation of the two-cycle or low byte programming in accordance with the present invention as illustrated in FIG. 1 above. After the preprogram verification operation has determined that the total number of bits that is required to be programmed is greater than 8, the control circuit 116 will provide an LBPGM signal which is at logic 1 and an HBPGM signal which is at logic 0 via step 410. Next, both the LBPGM signal and the HBPGM signal are being fed back to the second comparator circuit 120 across lines 134a and 134b respectively. In response to the LBPGM signal being at logic 1, the second comparator circuit 120 will trigger the programming circuit 113 so that it couples the drain pump 136 to memory cells 110a via step 412. When the HBPGM signal is at logic 0, the second comparator 120 will not trigger the programming circuit 113 to couple the drain pump 136 to memory cells 110b. Accordingly, only memory cells 110a will be programmed. Next, the drain pump 136 will be turned on for a fixed amount of time, for example, 15 microseconds, to allow for adequate programming of the memory cells 110a. The amount of time for programming is determined through software or hardware (for example, by using a timer). Next, the LBPGM signal will be switched from being at logic 1 to logic 0 after the amount of time set for programming has elapsed and programming can be stopped by allowing the programming circuit 113 to disconnect the drain pump 136 from the memory cells 110a via step 414. Thereafter, a postprogram verification operation will be performed via step 416 which will be further explained in FIG. 5.

Figure 4B:
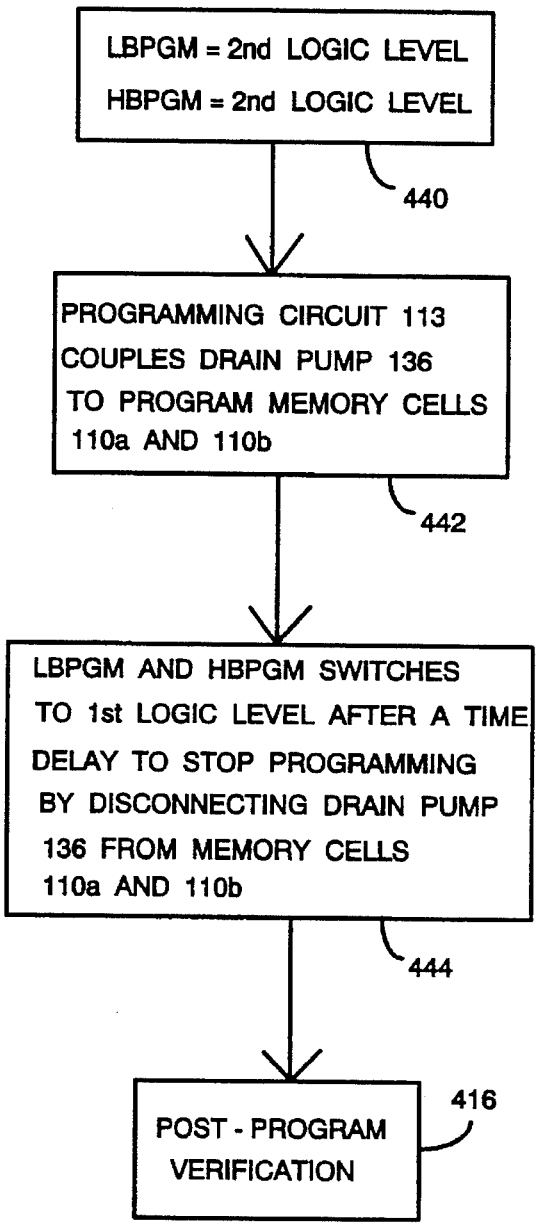
FIG. 4B is a flow chart showing one-cycle or word programming operation in accordance with the present invention as illustrated in FIG. 1 above.

Turning now to FIG. 4B, what is shown is a flow chart for one-cycle or word programming where all 16 bits are programmed simultaneously in accordance with the present invention as illustrated in FIG. 1 above. When the number of bits that are required to be programmed is less than 8, then drain pump 136 will be able to couple to all 16 bits simultaneously and provide the current needed since only those bits that require programming (bits that are at logic 0) draw current. In this case, the control circuit 116 will provide LBPGM and HBPGM signals which are at logic 1 via step 440. Then, the second comparator circuit 120 triggers the programming circuit 113 to couple drain pump 136 to both memory cells 110a and 110b so that both memory cells 110a and 110b can be programmed at the same time via step 442.

Again, the programming of memory cells 110a and 110b will last for a certain amount of time, which can be determined through software or hardware (for example, by using a timer). After the desired time has elapsed, then LBPGM and HBPGM signals will be reset to logic 0 and programming can be stopped by allowing the programming circuit 113 to disconnect the drain pump 136 from the memory cells 110a and 110b via step 444. Thereafter, a postprogram verification operation 416 will be performed which will be further explained in FIG. 5.

Figure 5:
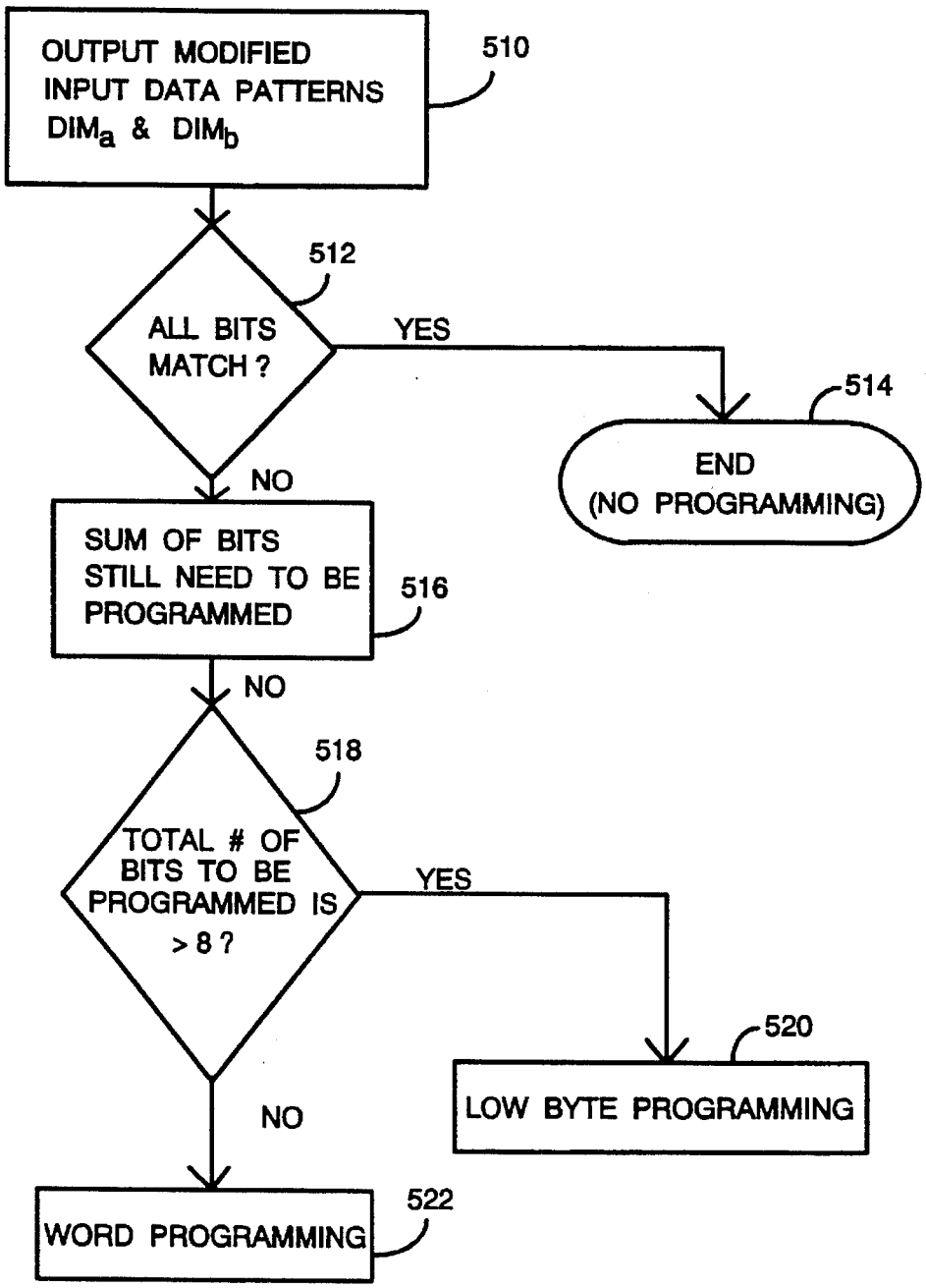
FIG. 5 is a flow chart showing a postprogram verification operation in accordance with the present invention as illustrated in FIG. 1 above.

Turning now to FIG. 5, what is shown is a postprogram verification operation of the integrated memory circuit 100 as illustrated in FIG. 1. Initially, the second comparator 120 provides modified input data pattern $DIM_{na}$ and $DIM_{nb}$ via step 510.

As stated earlier, immediately prior to the preprogram verification operation, memory cells 110a and 110b are assumed to have been fully erased, that is, they are all at logic 1. After the preprogram verification and programming operations, the number of bits that is still required to be programmed must be determined. A comparison between each corresponding bit of the memory cells 110a (or 110b) and the input data patterns $DQ_{na}$ are made to provide $DIM_{na}$ (or $DIM_{nb}$). As explained earlier, $DIM_{na}$ (or $DIM_{nb}$) has bits of information identical to the input pattern $DQ_{na}$ (or $DQ_{nb}$) except that if a bit in the input data pattern $DQ_{na}$ (or $DQ_{nb}$) and the corresponding bit in the memory cells 110a (or 110b), represented by $DSI_{na}$ (or $DSI_{nb}$) are both at logic 0, then the corresponding bit in the $DIM_{na}$ (or $DIM_{nb}$) will be at logic 1. When $DIM_{na}$ (or $DIM_{nb}$) is at logic 1, it indicates that no further programming is required for that bit. When a bit of the memory cells 110a (or 110b) is at logic 1 and the corresponding bit of the input data pattern $DQ_{na}$ (or $DQ_{nb}$) is at logic 0, the corresponding bit of the modified input data pattern $DIM_{na}$ (or $DIM_{nb}$) will be at logic 0. This indicates that programming is required for that bit. Accordingly, the number of memory cells that is required to be programmed after the preprogram verification and programming operation can be determined by summing the total number of bits of the modified input data patterns $DIM_{na}$ and $DIM_{nb}$ that are at logic 0.

Next, it must be determined whether all the bits in memory cells 110a and 110b matches with the input data patterns $DQ_{na}$ and $DQ_{nb}$ via step 512. If they match, the control circuit 116 will output the third program mode control signal, represented by the MATCH signal which is at logic 1, via step 514. In this case, no further programming is required. If case step 512 determines that the contents of some of the memory cells, as represented by $DSI_{na}$ or $DSI_{nb}$, do not match with the corresponding bits of the input data patterns $DQ_{na}$ or $DQ_{nb}$, the total number of bits that is required to be programmed must be determined. The summing circuit 122 computes the number of bits that is still required to be programmed by summing the number of bits of the modified input data pattern $DIM_{na}$ and $DIM_{nb}$ that are at logic 0 via step 516. Thereafter, it must be determined whether the total number of bits to be programmed is greater than 8 via step 518. If it is determined that the total number of bits to be programmed is greater than 8, then a low byte programming can be performed via step 520 which is similar to what is illustrated in the flow chart of FIG. 4A. On the other hand, if the total number of bits to be programmed is greater than zero, but less than or equal to 8, then a word programming can be performed via step 522 which is similar to what is illustrated in the flow chart of FIG. 4B.

The programming and postprogram verification operation can be repeated until it is determined that each of the bit in the memory cells 110a and 110b matches those in the input data pattern $DQ_{na}$ When that happens, the memory cells 110a and 110b are said to have been programmed according to the input data pattern $DQ_n$.

With random input data patterns during a normal operation, it is likely that not all 16 bits of memory cells 110a and 110b need to be programmed. Therefore memory cells 110a and 110b may go through many one-cycle programming before a two-cycle programming is required. Hence, the programming time associated with this invention will not be appreciably higher than that of a circuit which always programs all 16 bits at one time by undesirably doubling the number or the capacity of the drain pumps.

Accordingly, through the present invention, an integrated memory circuit which has a plurality of memory cells can be programmed effectively by providing a program mode for programming the memory cells in accordance with a number of bits of the input data pattern and then programming the memory cells in accordance with the program mode so provided. In so doing, it avoids the undesirable increase in the number or the current capacity of drain pumps formed on such memory circuits thus reducing the complexity of the design and minimizing the size of the memory circuit.

It should be understood that the above described embodiment is merely illustrating the possible specific embodiment which can represent application of the principles of the present invention. For example, the number of bits to be programmed in a one-cycle programming can be adjusted to other values, such as 4. Similarly, the total number of cycles for the programming operation can be varied as required, for example, depending on the density of the integrated memory circuit. For instance, a 32 Mbit flash EPROM organized as 1 million blocks of 32 bits each may be programmed using a one-cycle, two-cycle, three-cycle and four-cycle programming. In that case, a conventional drain pump with current capacity to program 8 bits simultaneously may be used.

Although the present invention has been described in the current embodiment and shown in the figures, one of ordinary skill in the art recognizes that there can be variations to the embodiments and those variations will be within the sphere and scope of the present invention. Accordingly, many modifications may be made by one of ordinary skill in the art without departing from the spirit and scope of the appended claims.

What is claimed is:

1. A method for programming a plurality of memory cells in response to an input data pattern having a plurality of bits of information, each bit being at a logic level which is either a first logic level or a second logic level, and each of the memory cells being capable of storing a bit of information, each bit being at a logic level which is either a first logic level or a second logic level, the method comprising the steps of:

(a) providing a program mode for programming the memory cells in accordance total number of memory cells that is required to be programmed including
  (i) determining the total number of memory cells that is required to be programmed, and
  (ii) providing a first program mode control signal if the total number of memory cells that is required to be programmed is greater than zero but is less than or equal to a threshold number N, providing a second program mode control signal if the total number of memory cells that is required to be programmed is more than said threshold number N, and providing a third program mode control signal if the total number of memory cells that is required to be programmed is equal to zero; and (b) programming the memory cells in accordance with said program mode.

2. The method as recited in claim 1, wherein said step of determining the total number of memory cells that is required to be programmed comprises the steps of:

(a) comparing the logic level of each bit of the input data pattern with the logic level of each corresponding bit stored in the memory cells; and (b) computing the total number of memory cells that is required to be programmed by summing the total number of bits of the input data pattern that are at the first logic level.

3. The method as recited in claim 2, wherein said step of summing comprises logically adding the number of bits of the input data pattern that are at the first logic level.

4. The method as recited in claim 2, wherein said step of summing comprises adding currents through a transistor circuit operatively coupled to the plurality of bits of the input data pattern.

5. The method as recited in claim 1, wherein the step of programming comprises the steps of:

(a) programming the plurality of memory cells simultaneously in response to said first program mode control signal;

(b) programming a first half of the plurality of memory cells and then a second half of the plurality of memory cells sequentially in response to said second program mode control signal; and (c) not programming any of the memory cells if said third program mode control signal is provided.

6. The method as recited in claim 1, wherein said threshold number N is determined by the total current capacity of a drain pump operatively coupled to the memory cells for supplying current to the memory cells during programming.

7. A method for controlling programming of an integrated memory circuit according to a plurality of input data patterns having a plurality of bits of information, each bit being at a logic level which is either a first logic level or a second logic level, the integrated memory circuit having a matrix of programmable memory cells, each memory cell being capable of storing one bit of information, each bit being at a logic level which is either a first logic level or a second logic level, the matrix of memory cells being organized into a plurality of blocks, each block including a plurality of groups, and each group including a plurality of memory cells, the method comprising the steps of:

(a) determining total number of memory cells that is required to be programmed in each block including (i) comparing the logic level of each bit of one of the plurality of input data patterns addressed to each block with the logic level of each corresponding bit stored in the memory cells in each block, and (ii) computing the total number of memory cells in each block that is required to be programmed by summing total number of bits of the one of the plurality of input data patterns addressed to each block that are at the first logic level;

(b) providing a first program mode control signal if the total number of memory cells that is required to be programmed in a block is greater than zero but is less than or equal to a threshold number N, providing a plurality of second programmed mode control signals if the total number of memory cells that is required to be programmed in a block is more than said threshold number N, and providing a third program mode control signal if the total number of memory cells that is required to be programmed in a block is equal to zero; and (c) programing said plurality of groups of memory cells simultaneously if said first program mode control signal is provided, programming the plurality of groups of memory cells in a multiple of n groups at a time if one of said plurality of second program mode control signals is provided, and not programming any of the memory cells if said third program mode control signal is provided.

8. The method as recited in claim 7 further including a post program verification operation, said post program verification operation comprising the steps of:

(a) determining the total number of memory cells that is required to be programmed in each block including (i) comparing the logic level of each bit of the one of the plurality of input data patterns addressed to each block with the logic level of each corresponding bit stored in the memory cells in each block, (ii) providing a plurality of modified input data patterns which have bits of information identical to the corresponding plurality of input data patterns, except that bits of said plurality of modified input data patterns are at the second logic level if the corresponding bits in the plurality of input data patterns and the memory cells are at the first logic level, and (iii) computing the total number of memory cells in each block that is required to be programmed by summing total number of bits of each of said plurality of modified input data patterns addressed to each block that are at the first logic level;

(b) providing said first program mode control signal if the total number of memory cells that is required to be programmed in a block is greater than zero but is less than or equal to a threshold number N, providing said plurality of second program mode control signals if the total number of memory cells that is required to be programmed in a block is more than the threshold number N, and providing said third program mode control signal if the total number of memory cells that is required to be programmed in a block is equal to zero;

(c) programming the plurality of groups of memory cells simultaneously if said first program mode control signal is provided, programming the plurality of groups of memory cells in a multiple of n groups at a time if one of said plurality of second program mode control signals is provided, and not programming any of the memory cells if said third program mode control signal is provided; and (d) repeating steps (a) to (c) until said third program mode control signal is provided.

9. The method as recited in claim 8, wherein said threshold number N and said n are determined by the total current capacities of a plurality of drain pumps formed on the integrated memory circuit and operatively coupled to the memory cells for supplying current to the memory cells during programming.

10. A method for controlling programming of an integrated memory circuit according to a plurality of input data patterns having a plurality of bits of information, each bit being at a logic level which is either a first logic level or a second logic level, the integrated memory circuit having a matrix of programmable memory cells, each memory cell being capable of storing one bit of information, each bit being at a logic level which is either a first logic level or a second logic level, the matrix of memory cells being organized into a plurality of blocks, each block including a plurality of groups, and each group including a plurality of memory cells, the method comprising the steps of:

(a) determining total numbers of memory cells that is required to be programmed in each block including (i) comparing the logic level of each bit of one of the plurality of input data patterns addressed to each block with the logic level of each corresponding bit stopped in the memory cells in each block, and (ii) computing the total number of memory cells in each block that is required to be programmed by summing total number of bits of the one of the plurality of input data patterns addressed to each block that are at the first logic level; and (b) providing a first program mode control signal if the total number of memory cells that is required to be programmed in a block is greater than zero but less than or equal to a threshold number N, providing a plurality of second program mode control signals if the total number of memory cells that is required to be programmed in a block is more than said threshold number N, and providing a third program mode control signal if the total number of memory cells that is required to be programmed in a block is equal to zero;

wherein said step of computing the total number of memory cells in each block that is required to be programmed comprises logically adding the number of bits of the one of the plurality of the input data patterns that are at the first logic level.

11. A method for controlling programming of an integrated memory circuit according to a plurality of input data patterns having a plurality of bits of information, each bit being at a logic level which is either a first logic level or a second logic level, the integrated memory circuit having a matrix of programmable memory cells, each memory cell being capable of storing one bit of information, each bit being at a logic level which is either a first logic level or a second logic level, the matrix of memory cells being organized into a plurality of blocks, each block including a plurality of groups, and each group including a plurality of memory cells, the method comprising the steps of:

(a) determining total number of memory cells that is required to be programmed in each block including (i) commanding the logic level of each bit of one of the plurality of input data patterns addressed to each block with the logic level of each corresponding bit stored in the memory cells in each block, and (ii) computing the total number of memory cells in each block that is required to be programmed by summing total number of bits of the one of the plurality of input data patterns addressed to each block that are at the first logic level; and (b) providing a first program mode control signal if the total number of memory cells that is required to be programmed in a block is greater than zero but less than or equal to a threshold numbers N, providing a plurality of second program mode control signals if the total number of memory cells that is required to be programmed in a block is more than said threshold numbers N, and providing a third program mode control signal if the total number of memory cells that is required to be programmed in a block is equal to zero;

wherein said step of computing the total numbers of memory cells in each block that is required to be programmed comprises adding currents through a transistor circuit operatively coupled to the plurality of bits of the input data patterns.

12. A method for controlling programming of an integrated memory circuit according to a plurality of input data patterns having a plurality of bits of information, each bit being at a logic level which is either a first logic level or a second logic level, the integrated memory circuit having a matrix of progammable memory cells, each memory cell being capable of storing one bit of information, each bit being at a logic level which is either a first logic level, or a second logic level the matrix of memory cells being organized into a plurality of words, each word including a first group and a second group, and each group including 8 memory cells, the method comprising the steps of:

(a) determining total number of memory cells that is required to be programmed in each word including (i) comparing the logic level of each bit of one of the plurality of input data patterns addressed to each word with the logic level of each corresponding bit stored in the memory cells in each word, and (ii) computing the total number of memory cells in each word that is required to be programmed by summing total number of bits of the one of the plurality of input data patterns addressed to said each word that are at the first logic level;

(b) providing a first program mode control signal if the total number of memory cells that is required to be programmed in a word is greater than zero but is less than or equal to 8, providing a second program mode control signal if the total number of memory cells that is required to be programmed in a word is more than 8, and providing a third program mode control signal if the total number of memory cells that is required to be programmed in a word is equal to zero; and (c) programming said first group and said second group of memory cells of each word simultaneously if said first program mode control signal is provided, programming the first group and the second group of memory cells sequentially if said second program mode control signal is provided, and not programming any of the memory cells if said third program mode control signal is provided.

13. The method as recited in claim 12 further including a post program verification mode, said post program verification mode comprising the steps of:

(a) determining the total number of memory cells that is required to be programmed in each word including (i) comparing the logic level of each bit of the one of the plurality of input data patterns addressed to each word with the logic level of each corresponding bit stored in the memory cells in each word, (ii) providing a plurality of modified input data patterns which have bits of information identical to the corresponding plurality of input data patterns, except that bits of said plurality of modified input data patterns are at the second logic level if the corresponding bits in the plurality of input data patterns and the memory cells are at the first logic level, and (iii) computing the total number of memory cells in each word that is required to be programmed by summing the total number of bits of said plurality of modified input data patterns addressed to said each word that are at the first logic level;

(b) providing a first program mode control signal if the total number of memory cells that is required to be programmed in a word is greater than zero but is less than or equal to 8, providing a second program mode control signal if the total number of memory cells that is required to be programmed in a word is more than 8, and providing a third program mode control signal if the total number of memory cells that is required to be programmed in a word is equal to zero;

(c) programming the first group and the second group of memory cells simultaneously if said first program mode control signal is provided, programming said first group and said second group of memory cells sequentially if said second program mode control signal is provided, and not programming any of the memory cells if the third program mode control signal is provided; and (d) repeating steps (a) to (c) until said third program mode control signal is provided.

14. The method as recited in claim 13, wherein said step of computing the total number of memory cells in each word that is required to be programmed comprises logically adding the number of bits of the input data pattern that are at the first logic level.

15. The method as recited in claim 13, wherein said steps of computing the total number of memory cells in each word that is required to be programmed comprises adding currents through a transistor circuit operatively coupled to the plurality of bits of the input data pattern.

16. An integrated memory circuit with programming controllable by an input data pattern having a plurality of bits of information, each bit being at a logic level which is either a first logic level or a second logic level, the integrated memory circuit having a plurality of memory cells, and each of the memory cells being capable of storing one bit of information, each bit being at a logic level which is either a first logic level or a second logic level, comprising:

a program mode determining means for determining a program mode for programming the memory cells in accordance with total number of memory cells that is required to be programmed, wherein said program mode determining means comprises:

a memory cell determining means for determining the total number of memory cells that is required to be programmed; and a control means for providing a first program mode control signal if the total number of memory cells that is required to be programmed is greater than zero but is less than or equal to a threshold number N, a second program mode control signal if the total number of memory cells that is required to be programmed is more than said threshold number N, and a third program mode control signal if the total number of memory cells that is required to be programmed is equal to zero; and a programming means operatively coupled to said program mode determining means for programming the memory cells in accordance with said program mode.

17. The integrated memory circuit as recited in claim 16, wherein said memory cell determining means comprises a first comparator means for comparing the logic level of each bit of the input data pattern with the logic level of each corresponding bit stored in the memory cells;

a second comparator means for comparing the logic level of each bit of the input data pattern with the logic level of each corresponding bit stored in the memory cells, and providing a modified input data pattern which has bits of information identical to the input data pattern, except that bits of said plurality of modified input data patterns are at the second logic level if the corresponding bits in the plurality of input data patterns and the memory cells are at the first logic level, and a summing means operatively coupled to said second comparator means for computing the total number of memory cells that is required to be programmed by selectively summing total number of bits of the input data pattern or said modified input data pattern that are at the first logic level.

18. The integrated memory circuit as recited in claim 17, wherein said computing means comprises a logic adder.

19. The integrated memory circuit as recited in claim 17, wherein said computing means comprises an analog adder.

20. The integrated memory circuit as recited in claim 16, further comprising a drain pump which is coupled by said programming means to said plurality of memory cells for programming the plurality of memory cells simultaneously in response to said first program mode control signal, and for programming a first half of the plurality of memory cells and a second half of the plurality of memory cells sequentially in response to said second program mode control signal.

21. The integrated memory circuit as recited in claim 20, wherein said threshold number N is determined by the current capacity of said drain pump.

22. An integrated memory circuit responsive to a plurality of input data patterns having a plurality of bits of information, each bit being at a logic level which either a first logic level or a second logic level, the integrated memory circuit having a matrix of programmable memory cells, each memory cell being capable of storing one bit of information, each bit being at a logic level which is either a first logic level or a second logic level, said matrix of memory cell being organized into a plurality of blocks, each block includes a plurality of groups, and each group including a plurality of memory cells, comprising:

a program mode determining circuit for determining a program mode for each block of memory cells according to total number of memory cells that is required to be programmed in each block in response to said plurality of input data patterns addressed to each block, said program mode determining circuit comprising a memory cell determining circuit for determining the total number of memory cells that is required to be programmed in each block, wherein said memory cell determining circuit comprises a first comparator circuit for comparing the logic level of each bit of the input data pattern addressed to each block with the logic level of the memory cells in each block, a second comparator circuit for comparing the logic level of each bit of one of the plurality of the input data patterns with the logic level of each corresponding bit stored in the memory cells, and providing a plurality of modified input data patterns which have bits of information identical to the plurality of input data patterns, except that bits of said plurality of modified input data patterns are at the second logic level if the corresponding bits in the plurality of input data patterns and the memory cells are at the first logic level, and a summing circuit operatively coupled to said second comparator circuit for computing the total number of memory cells on each block that is required to be programmed by selectively summing total number of bits of one of the plurality input data patterns or one of the plurality of said modified input data patterns addressed to said each block that are at the first logic level; and a control circuit operatively coupled to said memory cell determining circuit for providing a first program mode control signal if the total number of memory cells that is required to be programmed in a block is greater than zero but is less than or equal to a threshold number N, a plurality of second program mode control signals if the total number of memory cells that is required to be programmed in a block is more than said threshold number N, and a third program mode control signal if the total number of memory cells that is required to be programmed in a block is equal to zero; and a programming circuit operatively coupled to said program mode determining circuit for programming each block according to its respective program mode.

23. The integrated memory circuit as recited in claim 22, wherein said summing circuit comprises a logic adder.

24. The integrated memory circuit as recited in claim 22, wherein said summing circuit comprises an analog adder.

25. The integrated memory circuit as recited in claim 22 further comprising a plurality of drain pumps which is coupled by said programming circuit to said plurality of groups of memory cells for programming said plurality of groups of memory cells simultaneously in response to said first program mode control signal, and programming said plurality groups of memory cells in a multiple of n groups at a time in response to said second plurality of program mode control signals.

26. The integrated memory circuit as recited in claim 25, wherein said n and said threshold number N are determined by the total current capacities of said plurality of drain pumps.

27. An integrated memory circuit responsive to a plurality of input data patterns having a plurality of bits of information, each bit being at a logic level which is either a first logic level or a second logic level, the integrated memory circuit having a matrix of programmable memory cells, each memory cell being capable of storing one bit of information, each bit being at a logic level which is either a first logic level or a second logic level, said matrix of memory cells being organized into a plurality of blocks, each block including 2 groups, and each group including 8 memory cells, comprising:

a program mode determining circuit for determining a program mode for each block of memory cells according to total number of memory cells that is required to be programmed in each block in response to said plurality of input data patterns addressed to each block, said program mode determining circuit comprising a memory cell determining circuit for determining the total number of memory cells that is required to be programmed in each block, said memory cell determining circuit comprising a first comparator circuit for comparing the logic level of each bit of one of the plurality of the input data patterns addressed to each block with the logic level of the memory cells in each block, a second comparator circuit for comparing the logic level of each bit of one of the plurality of the input data patterns with the logic level of each corresponding bit stored in the memory cells, and providing a plurality of modified input data patterns which have bits of information identical to the plurality of input data patterns, except that bits of said plurality of modified input data patterns are at the second logic level if the corresponding bits in the plurality of input data patterns and the memory cells are at the first logic level, and a summing circuit operatively coupled to said second comparator circuit for computing the total number of memory cells in each block that is required to be programmed by selectively summing total number of bits of the one of the plurality of input data patterns or the corresponding one of said plurality of modified input data patterns addressed to said each block that are at the first logic level, and a control circuit operatively coupled to said memory cells determining circuit for providing a first program mode control signal if the total number of memory cells that is required to be programmed in a block is greater than zero but is less than or equal to a threshold number 8, a second program mode control signal if the total number of memory cells that is required to be programmed in a block is more than 8, and a third program mode control signal if the total number of memory cells that is required to be programmed in a block is equal to zero; and a programming circuit operatively coupled to said program mode determining circuit for programming each block according to its respective program mode.

28. The integrated memory circuit as recited in claim 27, wherein said summing circuit comprises a logic adder.

29. The integrated memory circuit as recited in claim 27, wherein said summing circuit comprises an analog adder.

30. The integrated memory circuit as recited in claim 27 further comprising a plurality of drain pumps which are coupled by said programming circuit to said 2 groups of memory cells for programming said 2 groups of memory cells simultaneously in response to said first program mode control signal, and programming said 2 groups of memory cells sequentially in response to said second program mode control signal.

* * * * *